(12) United States Patent
Hobbs et al.

(10) Patent No.: US 10,948,540 B2
(45) Date of Patent: Mar. 16, 2021

(54) INTEGRATED PROTOCOL ANALYZER CONFIGURED WITHIN AUTOMATED TEST EQUIPMENT (ATE) HARDWARE

(71) Applicant: Advantest Corporation, Tokyo (JP)

(72) Inventors: Jesse Hobbs, San Jose, CA (US); Alan Starr Krech, Jr., San Jose, CA (US); Kazuya Aramaki, San Jose, CA (US); Donald Organ, San Jose, CA (US); Jeffrey F. Stone, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 16/521,174

(22) Filed: Jul. 24, 2019

(65) Prior Publication Data
US 2020/0033409 A1    Jan. 30, 2020

Related U.S. Application Data

(60) Provisional application No. 62/711,400, filed on Jul. 27, 2018.

(51) Int. Cl.
*G01R 31/3183*    (2006.01)
*H04L 12/26*    (2006.01)
(Continued)

(52) U.S. Cl.
CPC ... *G01R 31/318307* (2013.01); *G06F 13/382* (2013.01); *G06F 16/9038* (2019.01);
(Continued)

(58) Field of Classification Search
CPC ....... G01R 31/318307; G06F 16/90335; G06F 16/9038; G06F 30/34; G06F 13/382; G06F 2213/0026; H04L 43/04
(Continued)

(56) References Cited

U.S. PATENT DOCUMENTS 6,173,440 B1    1/2001    Darty
6,449,741 B1    9/2002    Organ et al.
(Continued)

FOREIGN PATENT DOCUMENTS

EP    3518441 A1    7/2019

OTHER PUBLICATIONS

Fabay et al., A Test Port for Interfacing and Debugging ARM9 Processors Implemented in FPGA, Jan. 17, 2013, IEEE, pp. 1-5. (Year: 2013).*
(Continued)

*Primary Examiner* — John J Tabone, Jr

(57) ABSTRACT

A method for monitoring communications between a device under test (DUT) and an automated test equipment (ATE) is disclosed. The method comprises programming an interface core and a protocol analyzer module onto a programmable logic device, wherein the programmable logic device is controlled by a system controller and is operable to generate commands and data to test a DUT, wherein the interface core is operable to generate signals to communicate with the DUT using a protocol associated with the DUT. The method also comprises monitoring data and command traffic associated with the protocol in the interface core using the protocol analyzer module and storing results associated with the monitoring in a memory comprised within the protocol analyzer module. The method finally comprises transmitting the results upon request to an application program associated with the protocol analyzer module executing on the system controller.

21 Claims, 8 Drawing Sheets

(51) Int. Cl.
*G06F 16/9038* (2019.01)
*G06F 13/38* (2006.01)
*G06F 16/903* (2019.01)
*G06F 30/34* (2020.01)

(52) U.S. Cl.
CPC ........ *G06F 16/90335* (2019.01); *G06F 30/34* (2020.01); *H04L 43/04* (2013.01); *G06F 2213/0026* (2013.01)

(58) Field of Classification Search
USPC .......................................... 714/738, 742, 724
See application file for complete search history.

(56) References Cited

U.S. PATENT DOCUMENTS

| | | | |
|---|---|---|---|
| 9,164,821 | B2 | 10/2015 | Burghard et al. |
| 9,495,267 | B2 | 11/2016 | Buege et al. |
| 9,952,276 | B2* | 4/2018 | Frediani ............ G01R 31/2834 |
| 9,958,502 | B2 | 5/2018 | Goh et al. |
| 10,162,007 | B2* | 12/2018 | Chan ................ G01R 31/31907 |
| 10,379,158 | B2* | 8/2019 | Champoux ........ G01R 31/3177 |
| 10,613,963 | B2 | 4/2020 | Carosa |
| 2006/0123266 | A1 | 6/2006 | Matsumoto |
| 2007/0263649 | A1 | 11/2007 | Cuni et al. |
| 2008/0005630 | A1 | 1/2008 | Adsitt |
| 2008/0126874 | A1 | 5/2008 | Oyadomari et al. |
| 2010/0142543 | A1 | 6/2010 | Shaikh et al. |
| 2012/0079132 | A1 | 3/2012 | Liu et al. |
| 2012/0191402 | A1* | 7/2012 | Filler ................ G01R 31/31908 702/119 |
| 2013/0138383 | A1* | 5/2013 | Filler .................... G06F 11/263 702/123 |
| 2013/0266154 | A1 | 10/2013 | McCormack et al. |
| 2014/0122921 | A1 | 5/2014 | Imamichi et al. |
| 2014/0236524 | A1 | 8/2014 | Frediani |
| 2014/0244204 | A1* | 8/2014 | Frediani ........... G01R 31/31907 702/119 |
| 2016/0112287 | A1 | 4/2016 | Farmer et al. |
| 2018/0224502 | A1* | 8/2018 | Champoux ............. G06F 11/26 |
| 2019/0353696 | A1* | 11/2019 | Hsu .................. G01R 31/31703 |
| 2019/0354453 | A1* | 11/2019 | Hsu ......................... G06F 11/26 |

OTHER PUBLICATIONS

Nagappan, Meiyappan. :Analysis of Execution Log Files. In 2010 ACM/IEEE 32nd International Conference on Software Engineering, vol. 2, pp. 409-412.IEEE, 2010. (Year:2010).

* cited by examiner

INTEGRATED PROTOCOL ANALYZER CONFIGURED WITHIN AUTOMATED TEST EQUIPMENT (ATE) HARDWARE

CROSS-REFERENCE TO RELATED APPLICATIONS

This application is a conversion of and claims priority to and the benefit of Provisional Patent Application No. 62/711,400, entitled "INTEGRATED PROTOCOL ANALYZER," having a filing Date of Jul. 27, 2018, which is herein incorporated by reference in its entirety.

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

FIG. 1 is a schematic block diagram of a conventional automatic test equipment body 100 for testing certain typical DUTs e.g. a semiconductor memory device such as a DRAM. The ATE includes an ATE body 100 with hardware bus adapter sockets 110A-110N. Hardware bus adapter cards 110A-110N specific to a particular communication protocol, e.g. PCIe, USB, SATA, SAS etc., connect to the hardware bus adapter sockets provided on the ATE body and interface with the DUTs via cables specific to the respective protocol. The ATE body 100 also includes a tester processor 101 with an associated memory 108 to control the hardware components built into the ATE body 100 and to generate the commands and data necessary to communicate with the DUTs being tested through the hardware bus adapter cards. The tester processor 101 communicates with the hardware bus adapter cards over system bus 130. The tester processor may be programmed to include certain functional blocks including a pattern generator 102 and a comparator 106. Alternatively, the pattern generator 102 and comparator 106 may be hardware components mounted on an expansion or adapter card that plug into the ATE body 100.

The ATE body 100 tests the electrical functions of the DUTs 112A-112N connected to the ATE body 100 through hardware bus adapters plugged into the hardware bus adapter sockets of the ATE body 100. Accordingly, the tester processor 101 is programmed to communicate the test programs to be executed on the DUTs using the protocol unique to the hardware bus adapters. Meanwhile, the other hardware components built into the ATE body 100 communicate signals with each other and with the DUTs according to test programs operating in the tester processor 101.

The test program run by the tester processor 101 may include a function test which involves writing input signals created by the pattern generator 102 to the DUTs, reading out the written signals from the DUTs and using the comparator 106 to compare the output with the expected patterns. If the output does not match the input, the tester processor 101 will identify the DUT as being defective. For example, if the DUT is a memory device such as a DRAM, the test program will write data generated by the pattern generator 102 to the DUT using a Write Operation, read data from the DRAM using a Read Operation and compare the expected bit pattern with the read pattern using the comparator 106.

In conventional systems, the tester processor 101 needs to contain the functional logic blocks to generate the commands and test patterns used in testing the DUTs, such as the pattern generator 102 and the comparator 106, programmed in software directly on the processor. However, in some instances certain functional blocks such as the comparator 106 may be implemented on a field programmable gate array (FPGA), which is an application specific integrated circuit (ASIC) type semiconductor device that can program logic circuits according to a user's demand.

The FPGAs used in conventional systems rely on the tester processor 101 to transfer the commands and test patterns to the FPGA, which the FPGA in turn relays over to the DUTs. Because the tester processor, and not the FPGA, is responsible for generating the commands and test patterns, the number and type of DUTs that can be tested with a given ATE body is limited by the processing capabilities and programming of the tester processor. Where the tester processor generates all the commands and test patterns, bandwidth constraints on the system bus 130 connecting the tester processor to the various hardware components, including any FPGA devices and hardware bus adapter sockets, also places an upper limit on the number of DUTs that can tested simultaneously.

Also, in conventional systems, the communication protocol used to communicate with the DUTs is fixed because the hardware bus adapter cards that plug into the ATE body 100 are single purpose devices that are designed to communicate in only one protocol and cannot be reprogrammed to communicate in a different protocol. For example, an ATE body configured to test PCIe devices will have hardware bus adapter cards plugged into the body that support only the PCIe protocol. In order to test DUTs supporting a different protocol, e.g., Universal Flash Storage (UFS) the user would ordinarily need to replace the PCIe hardware bus adapter cards with bus adapter cards supporting the UFS protocol. Unless the PCIe hardware bus adapter cards are physically substituted with cards supporting the other protocol, such a system can only test DUTs that support the PCIe protocol. Thus, on the test floor, critical time is consumed replacing hardware bus adapter cards when DUTs running a different protocol from the one that the existing adapter cards support need to be tested.

Another drawback of conventional ATE systems relates to the test equipment required to test whether the ATE systems are communicating properly with the DUTs. Typically, ATE is used to test anywhere from one to several hundred devices under the test (DUTs) at the same time. In order to verify that the ATE is communicating properly with the DUTs, workbench equipment such as oscilloscopes and protocol analyzer can be used. These devices are typically bulky, cumbersome and inordinately expensive. Further, they require highly trained engineers to use and to interpret the data. As a result, these devices are not generally suitable for production facilities.

Protocol analyzers, for example, are passive diagnostic tools that collect, organize, and display protocol traffic occurring on a serial link. Protocol analyzers use large amounts of memory to store the traffic, typically many gigabytes. The stored traffic represents one of two forms of data: raw and protocol. In raw mode, the protocol analyzer saves the serial data bit for bit in its memory. In protocol mode, the protocol analyzer first decodes and descrambles the data prior to saving the data to memory. In both cases, the protocol analyzer uses a prohibitively large amount of memory to store all the diagnostic data for an engineer to be able to analyze.

Further, protocol analyzers require an electrical component, such as a probe, to be inserted into the signal path. The probe is able to monitor the signals carrying the protocol without interfering with those signals. The probe directs a copy of those signals to the protocol analyzer without deteriorating the signal itself. The challenge of using a conventional protocol analyzer with certain ATE systems is that the ATE system may be connected to hundreds of devices and may be able to communicate with each of the devices simultaneously. There would be no practical way to physically insert the hundreds of probes into the signal paths and the associated cabling would likely be unmanageable. Also, the cost would be prohibitive. Commercial protocol analyzers are prohibitively expensive and supporting hundreds of such protocol analyzers is simply not feasible in a test environment.

Accordingly, while there may be situations where it may be useful to have standard protocol analyzers, realistically, financial, space and memory constraints may limit the ability to have one. In such cases, lab engineers are not left with many choices for monitoring the signaling and communication link between the ATE and the DUTs.

An additional drawback associated with conventional ATE is that they typically only report pass/fail results or nominal information about the testing results. In other words, the ATE reports whether one or more devices under test (DUTs) passed or failed the respective test being executed with nominal information regarding the pass/fail results. The ATE is not configured to identify root causes of device failure that occur during qualification testing. Typically, the ATE will not have any hardware or software-based tools built into it that would enable engineers to easily diagnose problems with the DUTs.

In a typical testing environment, the engineers operating the ATE will need to identify the cause of failure manually by collecting data logs and performing analysis on the logs. This approach is labor intensive, error prone and not scalable. It may also not yield the desired result since there may not be enough information available to the engineers to determine which data logs to analyze or how to find the root causes of device failure within the data logs. Further, traditional ATE systems do not contain any intelligence built into the hardware that would help engineers capture and automatically interpret and analyze diagnostic information pertaining to the tests.

BRIEF SUMMARY OF THE INVENTION

Accordingly, a need exists for an integrated protocol analyzer that uses the pre-existing hardware of the tester to collect diagnostic information about the tests. Also, a need exists for an integrated protocol analyzer that uses filtering and triggering to selectively capture data and thereby reduce the amount of memory it needs for collection. Additionally, a need exists for a protocol analyzer that can collect critical information relevant to an engineer, selectively discard the less critical information, and report the critical information to the engineer in an organized and timely manner through a user-interface, e.g., a Graphical User Interface (GUI).

In addition, a need exists for an ATE that comprises a capture module that collects and monitors data being exchanged between a tester and a device under test (DUT) or data internal to the tester hardware in order to collect valuable information regarding the state of the tester over time.

In one embodiment, a method for monitoring communications between a device under test (DUT) and an automated test equipment (ATE) is disclosed. The method comprises programming an interface core and a protocol analyzer module onto a programmable logic device, wherein the programmable logic device is controlled by a system controller and is operable to generate commands and data to test a DUT, wherein the interface core is operable to generate signals to communicate with the DUT using a protocol associated with the DUT. The method also comprises monitoring data and command traffic associated with the protocol in the interface core using the protocol analyzer module and storing results associated with the monitoring in a memory comprised within the protocol analyzer module. The novel method finally comprises transmitting the results upon request to an application program associated with the protocol analyzer module executing on the system controller.

In another embodiment, an apparatus for diagnosing a cause of failure using automated test equipment (ATE) is disclose. The apparatus comprises a computer system comprising a system controller, wherein the system controller is communicatively coupled to a site module board comprising a tester processor and a programmable logic device, wherein the system controller is operable to transmit instructions to perform a test on a device under test (DUT) to the tester processor and the programmable logic device. It should be noted that the programmable logic device is operable to be communicatively coupled to the DUT and operable to generate commands and data for executing the test on the DUT, and wherein the programmable logic device comprises a protocol analyzer module and an interface core programmed on the programmable logic device, wherein the interface core is operable to generate signals to communicate with the DUT using a protocol associated with the DUT. The protocol analyzer module is operable to: a) monitor data and command traffic associated with the protocol in the interface core; b) filter information from the data and command traffic relevant to a user to create a filtered subset of data; c) store the filtered subset of data results in a memory associated with the protocol analyzer module; and d) transmit the results upon request to an application program associated with the protocol analyzer module executing on the system controller.

In a different embodiment, a tester comprises a system controller for controlling a test program for testing a plurality of DUTs and a plurality of modules coupled to the system controller and operable to interface with and test the plurality of DUTs, wherein each module comprises a site module board. Further, each site module board comprises: a) a tester processor coupled to communicate with the system controller to receive instructions and data therefrom in accordance with the test program; and b) a plurality of programmable logic devices coupled to the tester processor, each programmable logic device comprising an interface core and operable to generate test data for application to a respective DUT, and to receive and to compare test data generated by the respective DUT, and wherein the interface core of each programmable logic device is operable to be programmed to communicate with the respective DUT using a communication protocol compatible with the respective DUT, and wherein each of the programmable logic devices comprises a protocol analyzer module, wherein the protocol analyzer module is programmed on the programmable logic device and is operable to: (i) monitor data and command traffic associated with the protocol in the interface core; (ii) perform an action on the data and command traffic in response to a trigger; (iii) store a subset of data resulting from the action in a memory associated with the protocol analyzer module; and (iv) transmit the results upon request to an application program associated with the protocol analyzer module executing on the system controller.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

Figure 1:
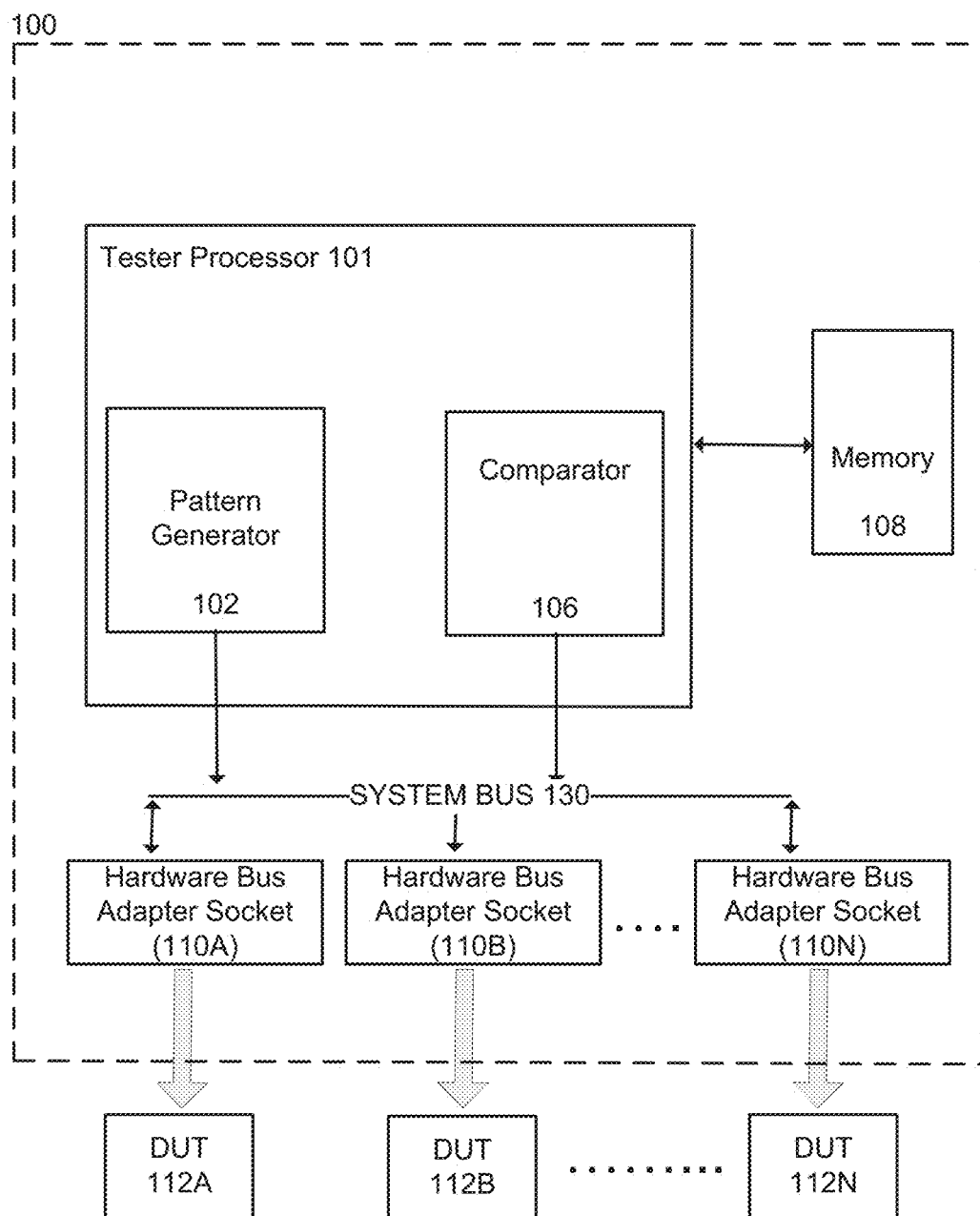
FIG. 1 is a schematic block diagram of a conventional automatic test equipment body for testing a typical device under test (DUT).

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

NOTATION AND NOMENCLATURE SECTION

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "programming", "monitoring," "saving," "performing," "transmitting," "receiving," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

An Integrated Protocol Analyzer Configured within Automated Test Equipment (ATE) Hardware Embodiments of the present invention provide a tester system with an integrated protocol analyzer (IPA) that is configured into the tester hardware. In other words, the protocol analyzer uses the pre-existing hardware of the tester to collect diagnostic information about the tests. Further, the IPA uses triggering and filtering techniques to reduce the amount of memory it needs for collection. Also, the IPA of the present invention can collect critical information relevant to an engineer, selectively discard the less critical information, and report the critical information to the engineer in an organized and timely manner.

Embodiments of the present invention further provide an IPA that can monitor the protocol signals used to communicate with the DUTs internally, within the tester hardware. For example, if FPGAs are used to communicate with the DUTs, the IPA can be implemented directly on the FPGA that is communicating with the DUTs and, thereby, have access to internal protocol signals that a standard protocol analyzer would not have. Because the IPA is implemented directly on the hardware (e.g., FPGAs), there is no need for additional probes and associated signaling that is typically associated with conventional desktop protocol analyzers. Further, the IPA can be implemented on multiple devices (e.g., FPGAs) within the hardware and, accordingly, embodiments of the present invention are able to monitor communication with hundreds of DUTs simultaneously (without requiring a standalone protocol analyzer). It should be noted that the IPA can also be implemented on a different custom ASIC other than an FPGA>

Figure 2:
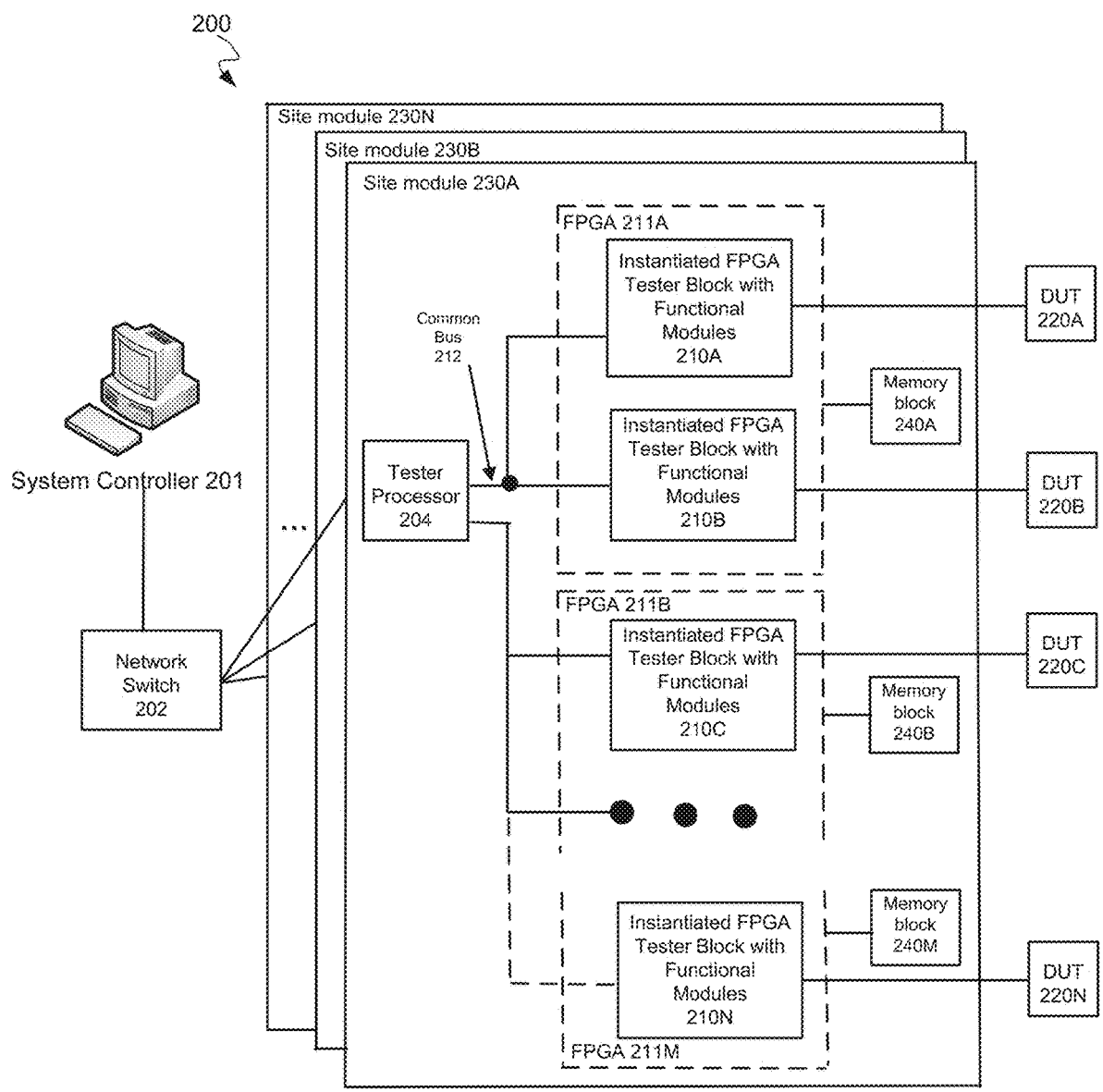
FIG. 2 is a high level schematic block diagram of the interconnections between the system controller, the site modules and the DUTs according to one embodiment of the present invention.

FIG. 2 is an exemplary high level block diagram of the automatic test equipment (ATE) apparatus 200 in which a tester processor is connected to the devices under test (DUTs) through FPGA devices with built-in functional modules in accordance with an embodiment of the present invention. In one embodiment, ATE apparatus 200 may be implemented within any testing system capable of testing multiple DUTs simultaneously.

Referring to FIG. 2, an ATE apparatus 200 for testing semiconductor devices more efficiently in accordance with an embodiment of the present invention includes a system controller 201, a network switch 202 connecting the system controller to the site module boards 230A-230N, FPGA devices 211A-211M comprising instantiated FPGA tester blocks 210A-210N, memory block modules 240A-240M wherein each of the memory blocks is connected to one of the FPGA devices 211A-211M, and the devices under test (DUTs) 220A-220N, wherein each device under test 220A-220N is connected to one of the instantiated FPGA tester blocks 210A-210N. It should be noted that the DUTs 220A-220N can, in one embodiment, be solid state drives (SSDs). The DUTs may communicate to the FPGA instantiated blocks using one or more of several different protocols, including Non-Volatile Memory Express (NVMe), PCIe and UFS.

In one embodiment, the system controller 201 may be a computer system, e.g., a personal computer (PC) that provides a user interface for the user of the ATE to load the test programs and run tests for the DUTs connected to the ATE 200. In one embodiment, the system controller 201 may be running the Linux operation system (OS). The Advantest FutureSuite software executing in the Linux environment is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 768 DUTs.

In one embodiment, the system controller 201 can be connected to the site module boards 230A-230N through a network switch, such as an Ethernet switch. In other embodiments, the network switch may be compatible with a different protocol such as TCP/IP, Fibre Channel, 802.11 or ATM, for instance.

In one embodiment, each of the site module boards 230A-230N may be a separate standalone board that attaches to custom-built load board fixtures, on which the DUTs 220A-220N are loaded, and also to the system controller 201 from where the test programs are received. In other embodiments, the site module boards may be implemented as plug-in expansion cards or as daughter boards that plug into the chassis of the system controller 201 directly. Alternatively, the site module boards may be housed within a stand-alone enclosure and may connect to the various DUTs using a device interface board (DIB).

The site module boards 230A-230N can each comprise at least one tester processor 204 and at least one FPGA device. In one embodiment, the tester processor and its associated memory may be located on a separate board (not shown) affixed to the respective site module. This separate board may be called a Computer On Module (or COM) board. In other words, the FPGA may be located on a site module board while the tester processor (with an associated memory) is located on a COM board.

The tester processor 204 and the FPGA devices 211A-211M on the site module board run the test methods for each test case in accordance with the test program instructions received from the system controller 201. In one embodiment the tester processor can be a commercially available Intel x86 CPU or any other well-known processor. Further, the tester processor may be operating on the Ubuntu OS x64 operating system and running the Core Software, which, for example, allows it to communicate with the software running on the system controller, to run the test methods. In one embodiment, the tester processor 204 may be an x86 processor running the Linux OS or a modified version of the Linux OS. In one embodiment, the Linux OS running on the tester processor is able to receive commands and data from the Windows OS running on the system controller. In alternate embodiments, other operating systems may be running on the tester processor. The tester processor 204 controls the FPGA devices on the site module and the DUTs connected to the site module based on the test program received from the system controller.

The tester processor 204 is connected to and can communicate with the FPGA devices over bus 212. In one embodiment, tester processor 204 communicates with each of the FPGA devices 211A-211M over a separate dedicated bus. In one embodiment, for example in the standard or bypass mode, tester processor 204 can control the testing of the DUTs 220A-220N transparently through the FPGAs with minimal processing functionality allocated to the FPGA devices. In this embodiment, the data traffic capacity of bus 212 can be exhausted rapidly because all the commands and data generated by the tester processor need to be communicated over the bus to the FPGA devices. In other embodiments, the tester processor 204 can share the processing load by allocating functionality to control the testing of the DUTs to the FPGA devices, e.g., in protocol independent data accelerations (PIDA) or full acceleration (FA) modes as will be discussed further below. In these embodiments, the traffic over bus 212 is reduced because the FPGA devices can generate their own commands and data.

In one embodiment, each of the FPGA devices 211A-211M is connected to its own dedicated memory block 240A-240M. These memory blocks can, among other things, be utilized to store the test pattern data that is written out to the DUTs. In one embodiment, each of the FPGA devices can comprise two instantiated FPGA tester blocks 210A-210B with functional modules for performing functions including implementation of communicative protocol engines and hardware accelerators as described further herein. In other embodiments, each FPGA device may comprise multiple instantiated FPGA tester blocks. Memory blocks 240A-240M can each contain one or more memory modules, wherein each memory module within the memory block can be dedicated to one or more of the instantiated FPGA tester blocks 210A-210B. Accordingly, each of the instantiated FPGA tester blocks 210A-210B can be connected to its own dedicated memory module within memory block 240A. In another embodiment, instantiated FPGA tester blocks 210A and 210B can share one of the memory modules within memory block 240A. In a different embodiment, each FPGA device can have multiple instantiated FPGA tester blocks, each with a respective memory block.

Further, each of the DUTs 220A-220N in the system can be connected to a dedicated instantiated FPGA tester block 210A-210N in a "tester per DUT" configuration, wherein each DUT is assigned its own tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block and be running a different test program. In a different embodiment, each instantiated FPGA tester block may also be connected to and configured to test multiple DUTs.

The architecture of the embodiment of the present invention depicted in FIG. 2 has several advantages. First, it eliminates the need for protocol-specific hardware bus adapter sockets and cards in the system because the communication protocol modules can be programmed directly on the instantiated FPGA tester blocks within the FPGA devices. The instantiated tester blocks can be configured to communicate with the DUTs in any protocols that the DUTs support, e.g., PCIe, UFS, SATA etc. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 201 without any kind of hardware interactions. An FPGA will typically include a configurable interface core (or IP core) that is programmable to provide functionality of one or more protocol based interfaces for a DUT and is programmable to interface with the DUT. For example, the FPGAs 211A-211M in the ATE apparatus 200 will include an interface core that can be configured with the PCIe protocol to test PCIe devices initially and subsequently reconfigured via a software download to test UFS-compliant devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs 211A-211M can be configured to run more than one communicative protocol, wherein these protocols also can be downloaded from system controller 201 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA is programmable with pre-verified interface or IP cores. This ensures compliance and compatibility according to a given interface standard. The programmable nature of the FPGA is utilized to optimize flexibility, cost, parallelism and ability to upgrade for storage testing applications from SSDs, HDDs and other protocol based storage devices.

For instance, in one embodiment, instantiated FPGA tester block 210A can be configured to run the PCIe protocol while instantiated FPGA tester block 210B can be configured to run the UFS protocol. This allows the tester hardware to test DUTs supporting different protocols simultaneously. FPGA 211A can now be connected to test a DUT that supports both PCIe and UFS protocols. Alternatively, it can be connected to test two different DUTs, one DUT supporting the PCIe protocol and the other DUT supporting the UFS protocol, where each instantiated functional module (e.g., 210A, 210B) is configured with a protocol to test the respective DUT to which it is connected.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

The other major advantage of the architecture presented in FIG. 2 is that it reduces processing load on the tester processor 204 by distributing the command and test pattern generating functionality to FPGA devices, where each DUT has a dedicated FPGA module running the test program specific to it. For instance, instantiated FPGA tester block 210A is connected to DUT 220A and runs test programs specific to DUT 220A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 212 connecting the tester processor with the other hardware components, including FPGA devices, device power supplies (DPS) and DUTs, is also reduced. As a result, more DUTs can be tested simultaneously than in prior configurations. In other words, without the tester processor 204 acting as a bottleneck, each of the FPGAs can connect to several DUTs and test them concurrently.

Figure 3:
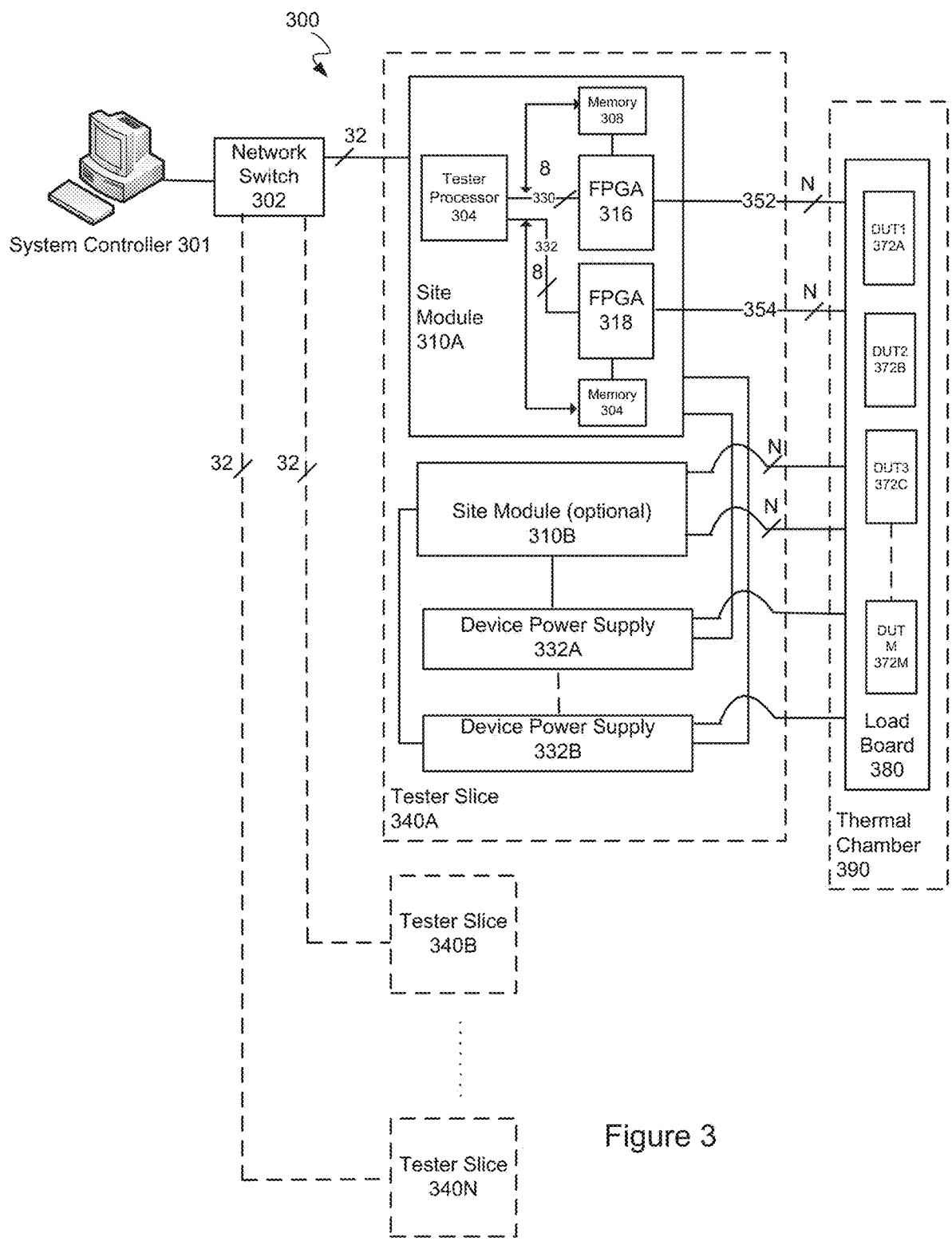
FIG. 3 is a detailed schematic block diagram of the site module and its interconnections with the system controller and the DUTs according to an embodiment of the present invention.

FIG. 3 provides a more detailed schematic block diagram of the site module and its interconnections with the system controller and the DUTs in accordance with an embodiment of the present invention.

Referring to FIG. 3, the site modules of the ATE apparatus, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. System controller 301 and network switch 302 perform the same function as elements 201 and 202 in FIG. 2 respectively. Network switch 302 can be connected to each of the site modules with a 32 bit wide bus.

As mentioned above, in one embodiment, the system controller 301 may be a computer system, e.g., a personal computer (PC) that provides a user interface for the user of the ATE to load the test programs and run tests for the DUTs connected to the ATE 300. Typically the system controller will run the Linux operating system. The Advantest Future-Suite is one example of test software normally used during device testing.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe).

In one embodiment, each site module is configured with two FPGAs as shown in FIG. 3. Each of the FPGAs 316 and 318 in the embodiment of FIG. 3. is controlled by the tester processor 304 and performs a similar function to FPGAs 211A-211M in FIG. 2. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., NVMe, Serial AT Attachment (SATA), etc.

FPGAs 316 and 318 are connected to memory modules 308 and 304 respectively, where the memory modules perform a similar function to memory blocks 240A-240N in FIG. 2. The memory modules are coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B. The DUTs may also connect to the FPGAs through a device interface board.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

In one embodiment, the communication protocol used to communicate between the tester processor 304 and the DUTs 372A-M can advantageously be reconfigurable. The communicative protocol engine in such an implementation is programmed directly into one or both of the FPGAs on the tester slice. The FPGA (e.g., 316 or 318) can therefore be configured to communicate with the DUTs in any protocol that the DUTs support. This advantageously eliminates the need for swapping out a tester each time a DUT with a different protocol needs to be tested. In one embodiment, the protocols can be high speed serial protocols, including but not limited to UFS, SATA, SAS, NVMe or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In one embodiment of the present invention, each FPGA comprises a number of protocol engine modules, wherein each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and UFS protocols, it can be connected to test a DUT that supports both PCIe and UFS protocols. Alternatively, it can be connected to test two different DUTs, one DUT supporting the PCIe protocol and the other DUT supporting the UFS protocol.

It should be noted that while the discussion in connection with FIGS. 2 and 3 has focused on FPGAs, the protocols (e.g., UFS, PCIe etc.) can also be implemented on other custom ASICs besides FPGAs.

Figure 4:
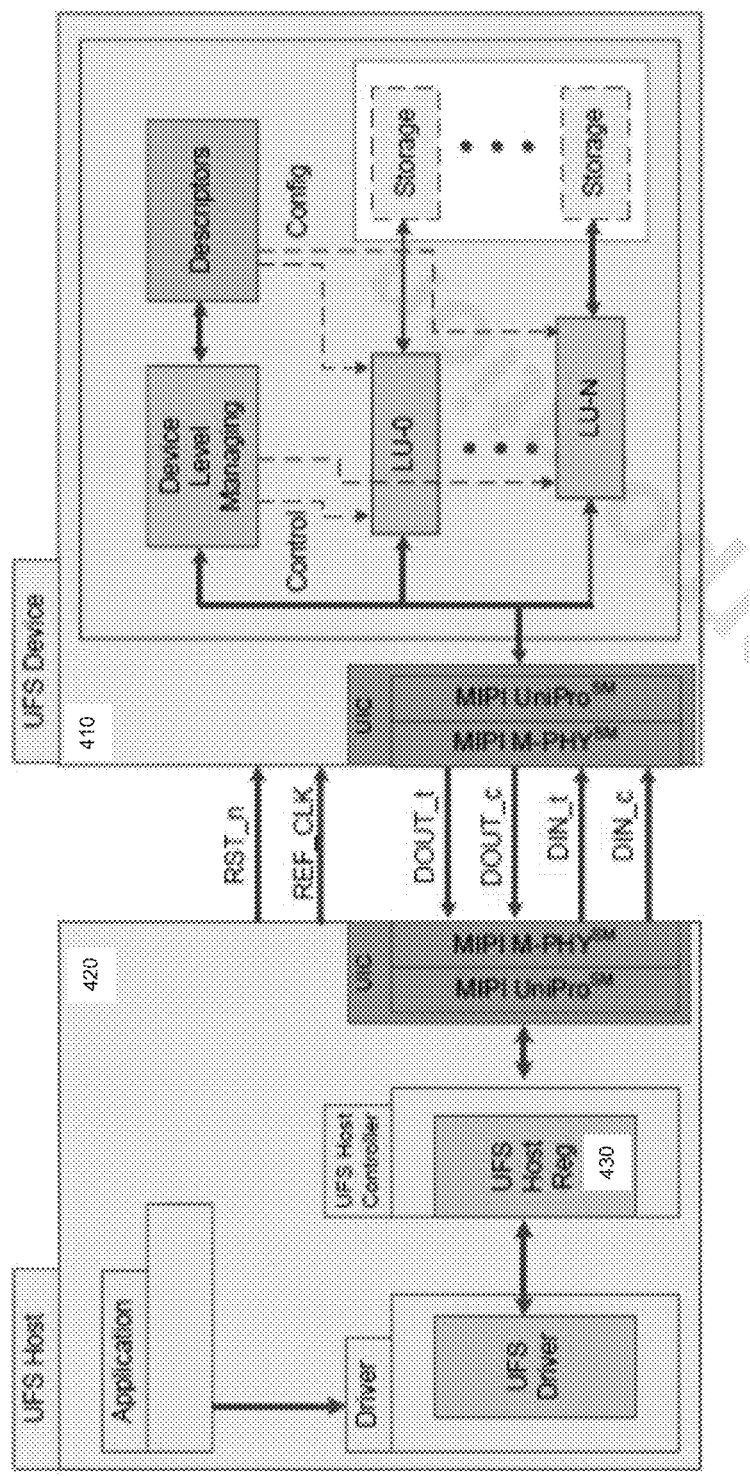
FIG. 4 illustrates a UFS device in communication with a UFS host.

FIG. 4 illustrates a UFS device in communication with a UFS host. As mentioned above, UFS is a high-speed communication protocol between a host controller 420 and a memory device 410. For example, in embodiments of the present invention, FPGAs 316 and 318, the host controllers, would communicate with and control the UFS-compliant DUTs, the memory devices.

The UFS host 420 comprises an application that wishes to communicate with the UFS device 410. The UFS host will communicate with the device (e.g., a DUT) using the UFS driver. The UFS driver is meant for managing the UFS host controller through the UFS HCI (UFS Host Controller Interface). The UFS HCI is typically a set of registers exposed by the host controller. The HCI is a defined interface between firmware (which implements the protocol stack for the UFS protocol, as will be discussed further in connection with FIG. 5), and application software, which implements sending requests and receiving responses via the HCI. The HCI may be comprised within the UFS Host Register module 430.

Integrated Protocol Analyzer

As mentioned previously, a drawback of conventional ATE systems relates to the test equipment required to test whether the ATE systems are communicating properly with the DUTs. A traditional protocol analyzer, for example, requires an electrical component, such as a probe, to be inserted into the signal path. With hundreds of DUTs connected to a single ATE, however, there is no practical way to physically insert hundreds of probes into the respective signal paths and the associated cabling would be unmanageable. Also, the cost would be prohibitive. Commercial protocol analyzers are prohibitively expensive and supporting hundreds of such protocol analyzers is simply not feasible in a test environment.

An additional drawback associated with conventional ATE is that they typically only report pass/fail results or other nominal information. In other words, the ATE only reports whether one or more devices under test (DUTs) passed or failed the respective test being executed. In some instances, conventional testers may provide address of failures and the expected versus actual data. However, the ATE is not configured to identify root causes of device failure that occur during qualification testing. Typically, the ATE will not have any hardware or software-based tools built into it that would enable engineers to easily diagnose problems with the DUTs. In a typical testing environment, the engineers operating the ATE will need to identify the cause of failure manually by collecting data logs and performing manual analysis on the logs. This approach is labor intensive, error prone and not scalable.

Figure 5:
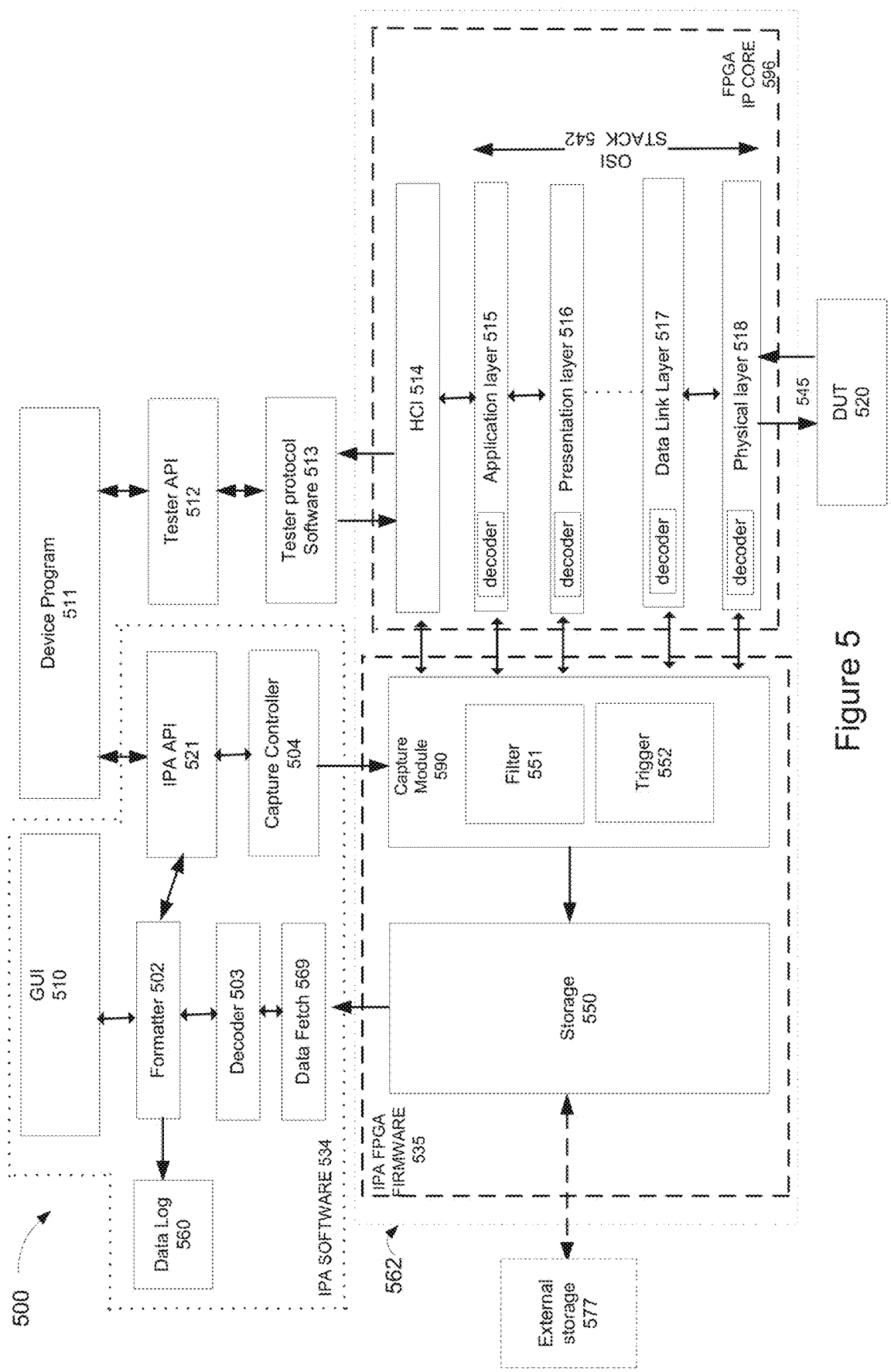
FIG. 5 illustrates a tester system with an IPA that is configured into the tester hardware in accordance with an embodiment of the present invention.

To address the drawbacks of conventional ATE, embodiments of the present invention provide a tester system with an integrated protocol analyzer (IPA) that is configured into the tester hardware. FIG. 5 illustrates a tester system 500 with an IPA that is configured into the tester hardware in accordance with an embodiment of the present invention.

In the embodiment of FIG. 5, the IPA is configured directly onto a programmable logic device, e.g., FPGA 316 or 318. In other words, the IPA is implemented using the pre-existing hardware of the tester, for example, the FPGA 562. It should be noted that while the IPA in FIG. 5 is illustrated as being implemented on an FPGA, the IPA can be implemented on any one of several types of programmable logic devices. It should be noted that the IPA is not limited to an FPGA and can be implemented on a custom ASIC as well.

In addition to the FPGA firmware component 535, the IPA also comprises a software component 534 that may be implemented, for example, on a system controller, e.g., system controller 301. In other words, the integrated protocol analyzer comprises both an FPGA firmware component 535 and a software component 534, the former being implemented on the FPGA 562 (along with the IP Core 596) while the latter is implemented in software on a server or desktop computer.

As noted above, the FPGA in the tester will typically include a configurable interface core (or IP core) 596 that is programmable to provide functionality of one or more protocol based interfaces for a DUT and is programmable to interface with the DUT. The IP Core 596 is the electrical signal generator and receiver for the signals exchanged over communication link 545. For example, the FPGAs, e.g., FPGAs 211A-211M and FPGAs 316 and 318 in the ATE apparatus will include an IP Core that may be configured with the PCIe protocol to test PCIe devices initially and subsequently reconfigured via a software download to test UFS-compliant devices. The embodiment of FIG. 5, however, illustrates an IP Core 596 that is configured to communicate with DUT 520 using the UFS protocol (the HCI module 514, as will be discussed further below is particular to the UFS protocol). It should be noted though the FPGA 562 can be reconfigured or re-programmed to support other types of protocols as well. Further, the IPA of the present invention can be used to monitor internal protocol signals of an IP Core 596 regardless of the type of protocol implemented on the IP Core.

The IPA firmware 535 can be implemented directly on an FPGA in addition to the FPGA IP Core 596. Implementing the IPA firmware 535 on the FPGA directly allows the protocol (e.g., PCIe, UFS, etc.) used to communicate with the DUTs to be monitored at or in the IP core 596. There is no need for additional probes and associated cabling. The protocol can be monitored for hundreds of devices simultaneously because the IPA firmware 535 can be implemented on each of the FPGAs, e.g., FPGAs 211A, 211B, etc. in communication with the DUTs. In one embodiment, a respective IPA can be implemented on each of the instantiated FPGA tester blocks, e.g., 210A, 210B, 210C, etc.

A conventional protocol analyzer would typically comprise an interposer that needs to be situated in between the protocol core 596 of the tester and a connected DUT 520. Alternatively, a conventional protocol analyzer or oscilloscope may comprise probes that tap off the signaling wires comprising communication link 545. In both these cases, monitoring communication link 545 by inserting an interposer or probing the line affects the test results from the subtlest to more coarse ways. Programming the protocol analyzer into the tester hardware advantageously avoids corrupting the test results because there is no need to physically probe or alter communication link 545 in any way.

In one embodiment, several features of a standalone protocol analyzer can be built into the software 534 and firmware 535 components of the IPA. For example, the IPA firmware and software can be programmed to collect diagnostic and other protocol related information about the tests. The IPA uses a capture module 590, comprising a trigger module 552 and filter module 551, to selectively capture desired signal information, thereby, reducing the amount of memory needed for data collection. In other words, the IPA firmware and software can be programmed to collect only the critical information relevant to an engineer using capture module 590, selectively discard the less critical information, and store the critical information to the engineer in an organized and timely manner in storage module 550. The storage module 550 may be a memory buffer implemented directly on the IPA FPGA firmware 535, thereby, requiring no additional circuitry for storing the critical information. Alternatively, the critical data may be stored in an external high speed buffer 577. It should be noted that the invention herein is not limited to FPGAs, the capture and storage modules of the present invention can be programmed onto other types of programmable logic devices or custom ASICs as well.

The protocol information can then be reported out to the user through the graphical user interface 510 (GUI) of the software module 534. In one embodiment of the present invention, the GUI 510 may be implemented on a system controller, e.g., system controller 301. The system controller may, for example, be an attached server or desktop computer. The desktop computer may be executing the GUI and other programs that allow the user to examine the protocol information using the GUI. The GUI and other application programs may also allow user-created scripting so that the user can direct the program to search the protocol data for anomalies and root causes of errors.

As noted above, conventional ATE is not configured to identify root causes of device failure that occur during qualification testing. In a typical testing environment, the engineers operating the ATE will need to identify the cause of failure manually by collecting data logs and performing manual analysis on the logs. Embodiments of the present invention build in scripting tools into the IPA software 534 that will parse through the data captured by the IPA firmware 535 and advantageously determine root causes of device failures by searching for anomalies in the log files (which may be preserved in data log module 560).

Embodiments of the present invention are also able to monitor the protocol signals (generated in connection with the protocol used to communicate with the DUT) internally, within the tester hardware. For example, if FPGAs are used to communicate with the DUTs, the IPA can be implemented directly on the FPGA that is communicating with the DUTs and, thereby, have access to internal protocol signals that a standard protocol analyzer would not have. Because the IPA is implemented directly on the hardware (e.g., FPGAs), there is no need for additional probes and associated signaling that is typically associated with conventional desktop protocol analyzers.

Integrating the IPA firmware module 535 with the FPGA IP Core module 596 on each FPGA allows the protocol analyzer capabilities to be made available for each FPGA connected with a DUT without the need for any additional probing or cabling. The IPA can be implemented on multiple FPGA devices within the hardware and, accordingly, embodiments of the present invention are able to monitor communication with hundreds of DUTs simultaneously (without requiring a standalone protocol analyzer). This also results in a substantial reduction in costs—the only cost of implementing the IPA firmware 535 is consumption of additional gate capacity in the FPGA. However, with the high gate counts of typical off-the-shelf FPGAs, this is an insignificant cost.

As noted previously, in the embodiment illustrated in FIG. 5, the IP Core 596 implements the UFS protocol. The UFS HCI module 514 is typically a set of registers exposed by the FPGA host controller. The HCI is a defined interface between the FPGA firmware (comprised, among other things, of the IPA FPGA firmware block 535 and the FPGA IP Core block 596), and application software 513, which implements sending requests and receiving responses via the HCI. The FPGA IP Core 596 receives the test or device program 511 through the tester API 512. The device program may, for example, execute on the system controller 301 and can be used to program the tester (including the FPGA 562) through the tester API 512. The test protocol software 513 communicates with the HCI module 514 in firmware and conveys protocol information from the OSI stack 542 back to the system controller using tester API 512.

In one embodiment, the IP Core 596 implements the OSI protocol stack 542. As is well known, the OSI protocol stack 542 comprises at least 7 layers, including an application layer 515, a presentation layer 516, a data link layer 517 and a physical layer 518. UFS communication is a layered communication architecture. The electrical interface for UFS uses the physical layer 418 comprising the board components, PCB channel, and actual voltage signals for link 545 that are communicated with the connected DUT 520.

In a conventional tester system, the physical signals of the communication link 545 would need to be probed by a standalone instrument. Further, the standalone protocol analyzer would only have access to the external signals of the communication link 545 and would need to reconstruct the internal state of the firmware (including any internal signals within the IP Core 596, e.g., signals communicated between the various layers in the OSI stack 542) using the external signals of link 545.

Implementing the IPA in firmware (using the firmware module 535) and in software (using the software module 534), enables signals that are internal to the IP Core 596 to become visible and available for inspection internally using the FPGA firmware 535. Using capture module 590 and storage buffer 550 allows the tester to advantageously collect information pertaining to device failure from modules and buffers inside the tester firmware itself. As a result the IPA of the present invention provides better tracing information leading up to and following failures plus the ability to further debug beyond just what was easily measured as a pass or fail address/data location.

For example, as shown in FIG. 5, the capture module 590 would have access to signals at each level of the protocol stack 596. The capture module may be able to access and monitor signals from the HCI interface 514. The HCI interface provides access to the FPGA firmware and to modules within the firmware that keep track of and hold the internal states of the firmware. The IPA of the present invention is able to provide access to these internal states of the firmware that a traditional protocol analyzer simply would not be able to access.

Further, the capture module 590 may be able to monitor signals being transmitted to or from one of the protocol layers (e.g., application layer 515, presentation layer 516). In other words, the capture module may be configured to tap into signals internal to each of the protocol layers. The capture module may further be able to monitor transactions between the various protocol layers. Unlike a traditional protocol analyzer, the IPA firmware 535 would have direct access to the intermediate protocol signals from the OSI stack implemented in the IP core 596, and would not need to reconstruct the information using only the signals of the link 545 at the level of the DUT interface.

In one embodiment, a capture module 590 can comprise a traffic-filtering module 551. A filtering module 551 selectively reduces the amount of traffic that the capture module will collect. Because buffer space inside the FPGA is limited, a filtering module may be used within the capture module 590 to filter or selectively choose a subset of the packets that would be of most interest to the user for diagnostic purposes.

In one embodiment, the acquisition logic of the filtering module 551 of the capture block selects and captures the information regarding the data traffic, states or status of various signals and transfers the information to the storage block 550 so it can be saved. The acquisition logic of the filtering module 551 can also selectively capture the desired data. In other words, the acquisition logic may be programmed to gather only a subset of data inputted into the capture block. Certain configuration bits can be programmed into the filtering logic that specify how much of the incoming data should be captured, e.g., in certain instances only the headers of the incoming packets may need to be captured.

In one embodiment, the filtering module 551 of the capture module may only capture certain types of data, e.g., data packets with a particular bit configuration. The filtering module can also be programmed to selectively capture only the desired data packets while ignoring the rest.

In one embodiment, the capture module 590 can comprise a trigger module 552. The trigger module 552 comprises FPGA logic that stops a capture based upon a detected event. In other words, if a user wanted to stop capturing traffic after detecting a particular condition, the trigger module can be programmed to detect the condition. In one embodiment, the trigger module 552 may trigger to start once an event is detected, for instance, capture data once it detects a particular type of pattern in the incoming data. In other words, the trigger module 552 may be configured to pattern match data until it detects a match and, subsequently, capture any incoming data.

In one embodiment, the triggering module 552 may have the additional capability of compressing data received from the IP Core 596 by identifying identical sequences that repeat. For example, in certain communication protocols, identical training sequences are sent repeatedly, sometimes in the thousands. The triggering module 552 can, in one embodiment, collect the first one and keep track of the number of times the identical sequence was transmitted (or received) from, for example, the DUT 520. In one embodiment, this functionality is provided by a combination of trigger module 552 and filtering module 551. For example, the trigger module 552 may find and save the first of the repeated patterns or packets. The filtering module 551 may then remove and count the redundant patterns.

By comparison, conventional protocol analyzers collect all the sequences and optionally perform the compression when displaying the sequences to the user. The IPA, on the other hand, will advantageously only report out the first collected sequence and indicate the number of times it was transmitted. In one embodiment, this report may be presented to the user through GUI 510. It should be noted that the memory 550 for the IPA of the present invention will be significantly less than a memory required for a conventional protocol analyzer because the IPA of the present invention will only save critical information that needs to be reported out to the user and discard the less critical information.

In one embodiment, the trigger module 552 may be configured to recognize certain pre-determined decoded patterns in each of the layers of the OSI stack 542. As shown in FIG. 5, each layer of the OSI stack comprises a decoder that decodes signals from the respective layer. The trigger module can trigger on any decoded patterns from each layer of the OSI stack. In other words, the trigger module 552 is able to tap into the protocol signals being exchanged between the layer and trigger on any event, condition or pattern that appears on the signals.

In one embodiment, the trigger module 552 may also be configured to perform selective discard. For example, in certain protocols, e.g., PCIe, repeated training sequences need to be transmitted that do not need to be reported to the user. The trigger module 552 can monitor and discard those training patterns. Further, the IPA may create and report out only if the pattern appears to fall outside of specification mandates. In other words, the trigger module 552 may be programmed to check patterns to determine if they were out of specification mandates—in such a case, a report would be created for the user through GUI 510.

The decoder within each of the application layers within the IP Core 596 decodes signals within a respective layer to provide attributes that are stored at each layer. Each layer will typically comprise its own attributes as a result of the decoding. In one embodiment, the IPA is capable of performing triggering and filtering in the capture module 590 using the attributes associated with each of the respective application layers.

By comparison, a standalone protocol analyzer would not typically have exposure to the intermediate decoded signals communicated between layers. The standalone protocol analyzer would instead need to decode physical signals comprising link 545 in order to derive or extract any internal states or signals within the OSI stack 542.

It should be noted that in some embodiments, the functionality of the trigger module 552 and filter module 551 might be split between the capture module 590 and storage module 550. In other words, the storage module 550 may perform some of the triggering and filtering features explained above.

In one embodiment, the capture module 590 may be configured using a capture controller module 504 on the tester. The device program 511 through the IPA API 521 accesses the capture controller module 504 on the tester. The IPA API may be an interface executing, for example, on the system controller along with the device program 511. The device program 511, designed by the user, will typically control the types of triggers and filters set up on the capture module 590. The device program 511 accesses the capture module 590 and configures the triggering and filtering conditions using capture controller module 504. As mentioned earlier, the device program 511 also controls the manner in which the firmware will be programmed, e.g., through the HCI interface 514.

In one embodiment, the data accumulated by the capture module 590 is stored in the storage module 550 (also implemented on the FPGA 562) or, alternatively, on external storage module 577. The captured data is accessed by a data fetch module 569, decoded by a decoder 503, and formatted using a formatter module 502. The data can be logged on a data log module 560. The critical data, including the information that is of most interest to the tester, may be selected and displayed through the GUI 510.

In one embodiment, the data fetch module 569 links the IPA software 534 to the IPA firmware 535. The data fetch module may retrieve the data from storage module 550 and store it in a way so that it may be easily accessed by the software components. In one embodiment, the data decoder may decode the data from the data fetch module and interpret it to identify error and other conditions of interest to the user. In one embodiment, some of the data analysis capabilities including user-prepared scripts to parse through the test data may be built into the decoder module 503.

In one embodiment, the protocol traffic captured from the capture module of the IPA can be transmitted to software 534 and converted into a graphical illustration. Most conventional protocol analyzers display the data in a graphical format. Accordingly, embodiments of the present invention facilitate analysis by graphically displaying the data captured. The graphical interface is usually easier to interpret and use because the data has been sorted and labeled to highlight key features of the communication that would otherwise need to be manually teased out of the raw textual data by referring to the protocol specification. Accordingly, software 534 can perform further post-processing of the data gathered from the capture module in order for the user to be able to view the data in a graphical manner using GUI 510.

In one embodiment, the capture module may be programmed with the necessary logic to identify and flag any error condition that may occur during any stage of the communication between the protocol stacks. The capture module may be further programmed to determine if the error resulted from the DUT or resulted from a problem in the protocol stacks within IP Core 596. For example, if an error condition is detected in the data received from any of the signals or states under investigation in the protocol stacks, the capture module may comprise the necessary logic to identify and flag the error condition. The error condition information may then be transferred to the storage module 550 and subsequently to the GUI 510.

In one embodiment, capture module 590 may be programmed to analyze the data received from a connected DUT, e.g., DUT 520, and identify a device failure precursor. In other words, capture module 590 may use the data gathered from the DUT to indicate that the DUT will fail imminently. Capture module 590 may then flag an error condition or a potential error condition and relay information pertaining to the error to GUI 510 so the user can be alerted.

In one embodiment, capture module 590 may also contain logic circuitry and be programmed to analyze the information captured and to identify a cause of error. For example, the capture module may be programmed with a rule checker that is run on the information collected. In other words, the rule-checker can parse through all the failure related information captured to identify some possible causes of the failure by running a set of rules on the information captured.

In one embodiment, the capture module logic may vary depending on the protocol implemented by the IP Core 596. For example, capture module logic for interfacing with an IP Core 596 implementing the PCIe protocol may be different from capture module logic for interfacing with an IP Core running the UFS protocol of FIG. 5.

In one embodiment, a capture module may comprise logic that logs activity detection events. If there is any activity detected on certain designated lines within the IP Core 596, the capture module will log such events to present to the user.

In one embodiment, a capture module 590 can comprise data logging capture capabilities. The capture module comprises FPGA logic that compares the expected versus received data and displays the results to the user by sending them to software block 534 where the GUI 510 displays the results to the user.

In one embodiment, a timestamp is associated with each entry when it is saved in the storage module 550. This allows the data to be sorted easily. This is especially convenient after data from the capture module in the FPGA has been transferred to the software module 534. The time-stamped data can be sorted using the time-stamps, which makes it advantageous for an engineer to quickly view and interpret the results in time-order and diagnose any problems. In addition to the data and the time-stamp, in some cases metadata may also be stored with the entries from the capture module 590 containing additional details regarding the event. For example, if the capture module stores information pertaining to state change events, then metadata regarding the type of state change event may be saved with each entry in the storage module 550.

Figure 6:
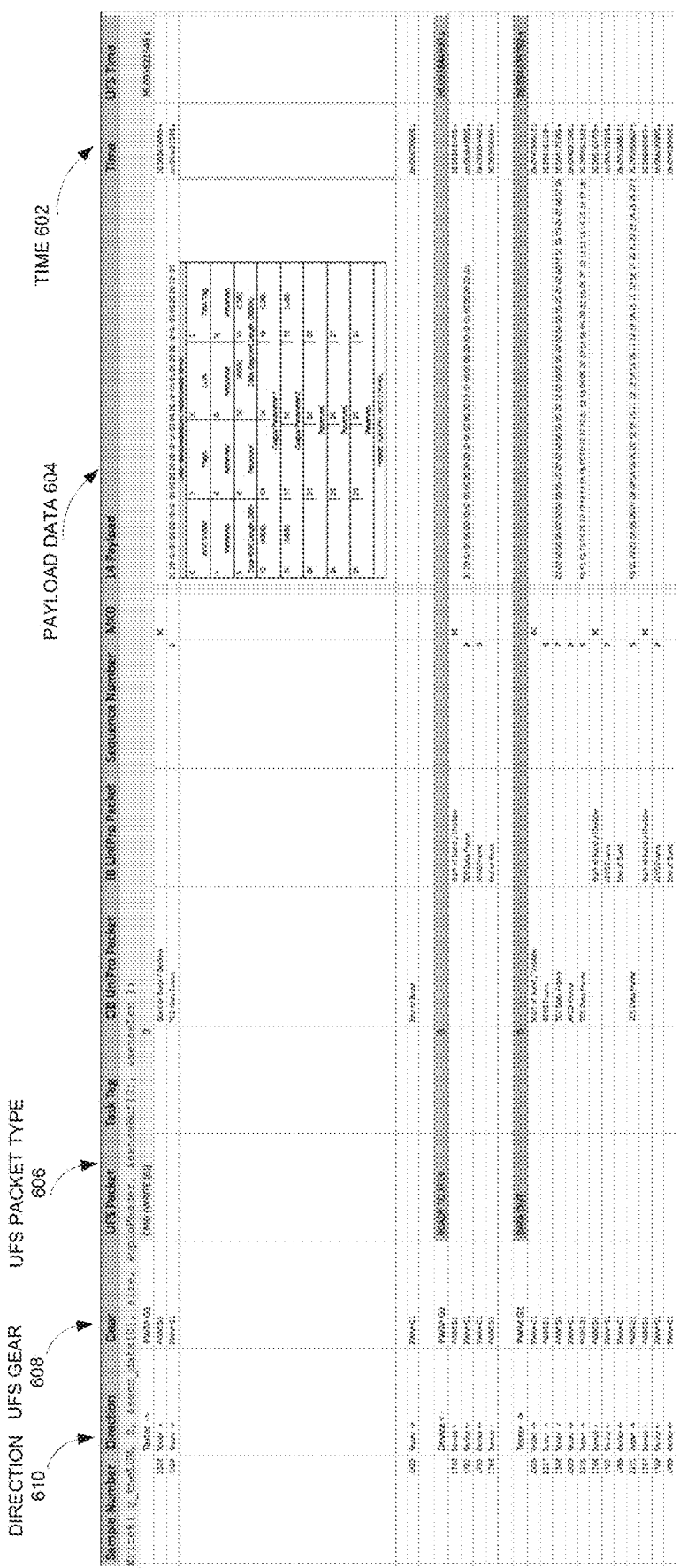
FIG. 6 illustrates an exemplary output that can be displayed through the GUI to a user in accordance with an embodiment of the present invention.

FIG. 6 illustrates an exemplary on screen output that would be displayed through the GUI to a user or printed in accordance with an embodiment of the present invention. As discussed in connection with FIG. 5, the GUI 510 displays protocol details regarding the testing of DUT 520. For example, the user interface provides details regarding the direction 610 of the test—whether the data is being transmitted from the FPGA 562 to DUT 520 or received from the DUT 520.

The interface may also have details regarding the speed at which communication is taking place. For example, if the protocol of choice is UFS, the interface may provide details regarding the UFS gear 608 being used for the communication. As is well known, the UFS protocol communicates using 4 high speed gears and a multitude of low speed gears.

The interface may also comprise details regarding the UFS packet type 606, e.g., a write or read packet. Additionally, the interface may comprise details regarding payload data 604, e.g., the data communicated to and from the DUT. Further, the interface may comprise timestamps 602, which report the timestamp on each packet of payload data.

Figure 7:
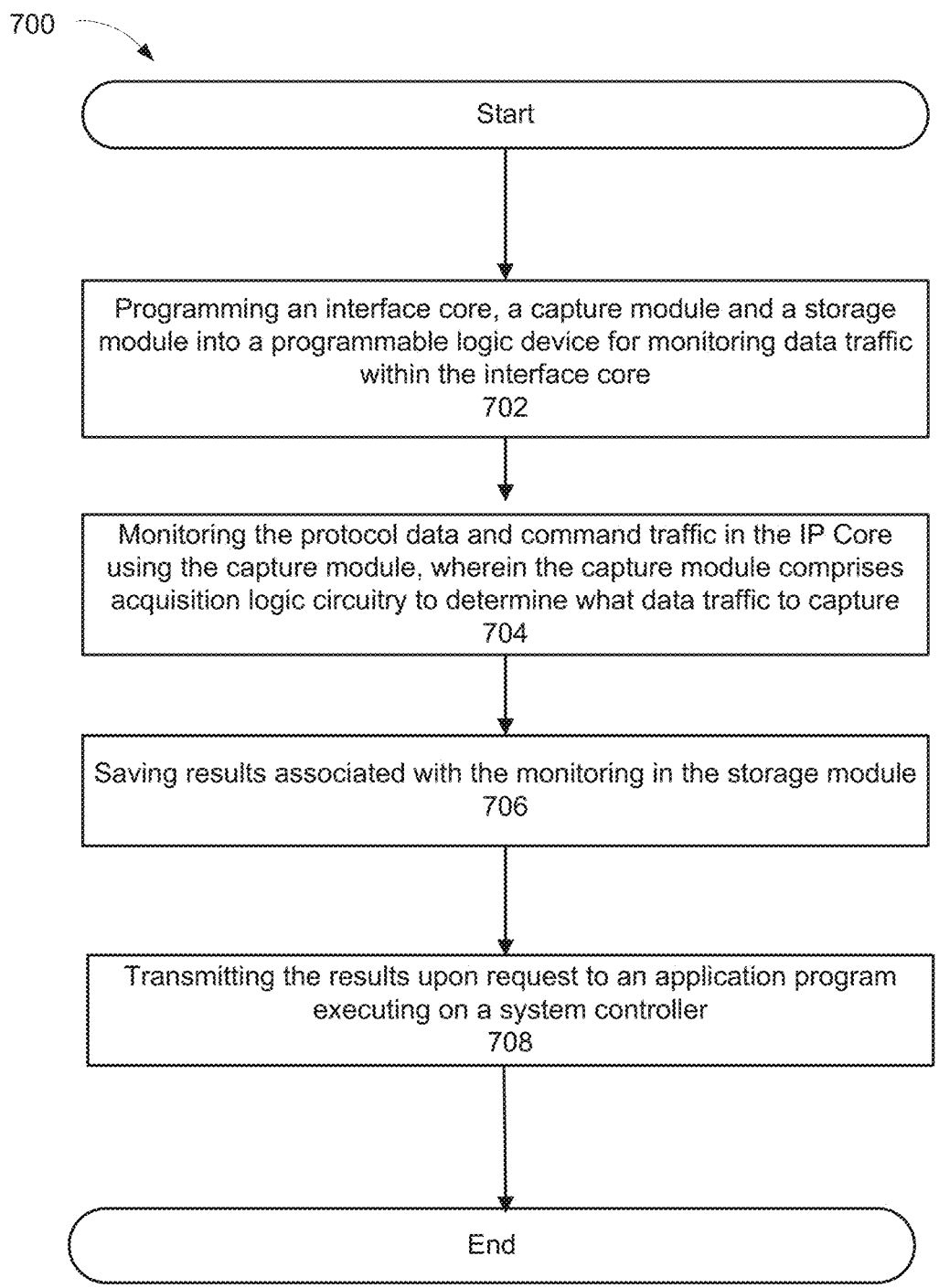
FIG. 7 illustrates a flowchart of an exemplary computer implemented process for monitoring protocol data and command traffic during automated device testing in accordance with one embodiment of the present invention.

FIG. 7 illustrates a flowchart of an exemplary computer implemented process 700 for monitoring protocol data and command traffic during automated device testing in accordance with one embodiment of the present invention.

At step 702, an interface core (or IP core), a capture module, and a storage module are implemented on a programmable logic device, e.g., an FPGA. The IP Core 596 wraps commands into a standard protocol (e.g., UFS) for transmission over a physical channel. The IP Core 596 also generates and receives electrical signals for transmitting over the physical channel. The capture module 590 is configured to capture protocol related traffic from the IP Core while the storage module 550 is configured to store the data captured by the capture module 590.

At step 704, the protocol data and command traffic in the IP Core 596 is monitored using the capture module. In one embodiment, the capture module 590 comprises a triggering module 552 and a filtering module 551. Among other functions, the filtering module filters out particular types or subsets of data or packets of data. Further, the trigger module, among other things, triggers on certain patterns of data or certain events in the data to perform actions based on recognizing the respective patterns or events.

At step 706, the results associated with the monitoring activities are saved in the storage module 550 that is also implemented on the programmable logic device.

Finally, at step 708, the results are transmitted to the tester software application program executing on the system controller. In one embodiment, the results may be decoded and formatted and displayed to a user through a GUI, e.g., GUI 510.

Figure 8:
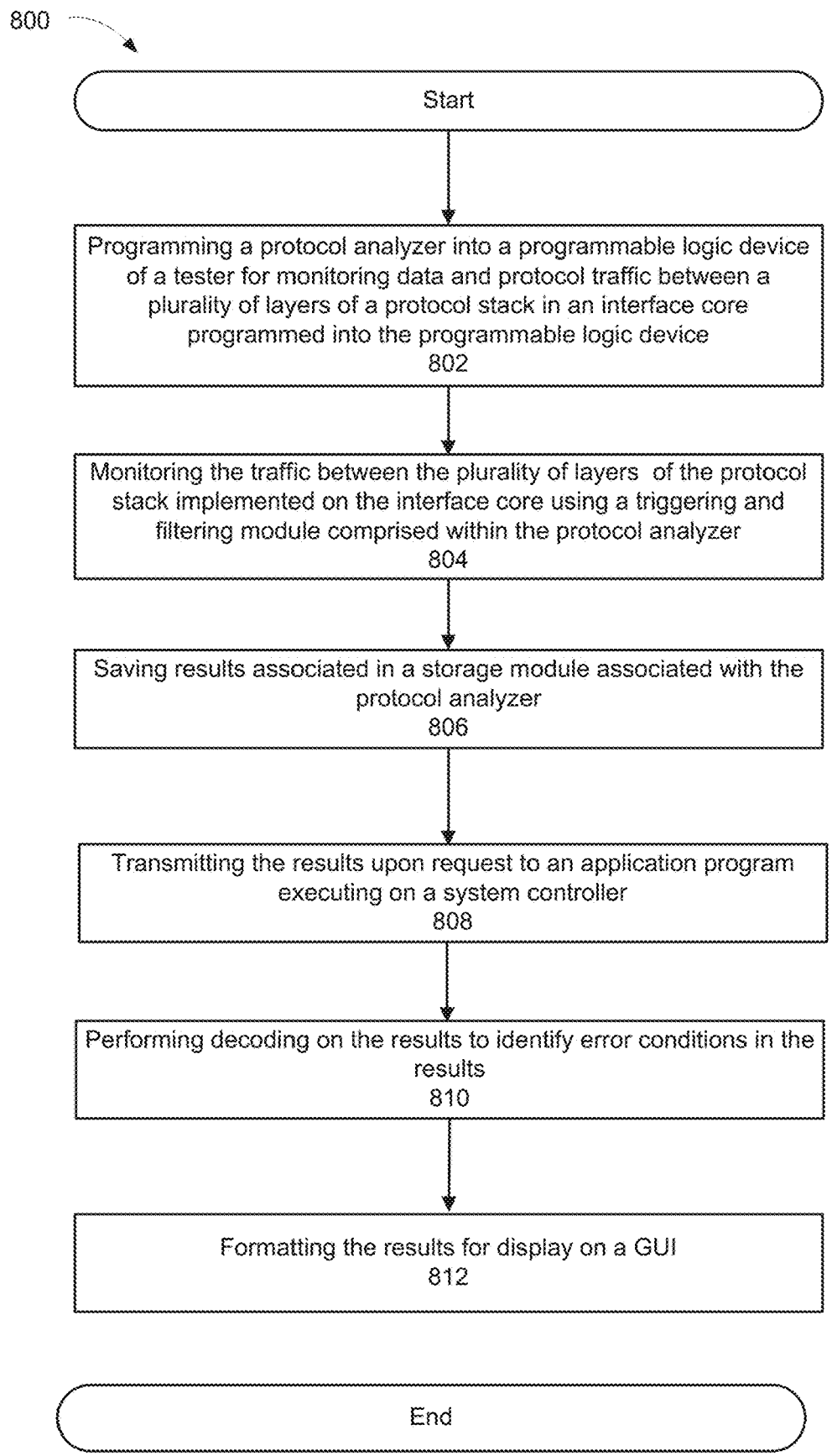
FIG. 8 illustrates a flowchart of an exemplary computer implemented process for programming an integrated protocol analyzer in a tester to collect and display information in accordance with one embodiment of the present invention.

FIG. 8 illustrates a flowchart of an exemplary computer implemented process 800 for programming an integrated protocol analyzer in a tester to collect and display information in accordance with one embodiment of the present invention.

At step 802, an IPA is programmed into a programmable logic device, e.g., an FPGA, to monitor data and protocol traffic between the various layers of the protocol stack of the IP Core 596. More specifically, the IPA can monitor the signals transmitted between the various protocol layers of the IP Core 596. The IPA may also monitor signals communicated between a DUT 520 and the IP Core 596. The FPGA, e.g., FPGA 562, may be connected to one or more DUTs, e.g., DUT 520, to be tested. Further, the FPGA is also connected to a system controller, e.g., system controller 301 that executes the tester software application program and/or the device program for coordinating the tests.

At step 804, the data traffic between the various layers of the protocol stack implemented on the IP Core 596 and between the DUT 520 and the IP Core 596 are monitored using the protocol analyzer. The protocol analyzer may comprise a filtering module and a triggering module. As mentioned previously, the filtering module filters out particular types or subsets of data or packets of data. Further, the trigger module, among other things, triggers on certain patterns of data or certain events in the data to perform actions based on recognizing the respective patterns or events. One of the functions of the filtering and triggering would be to compress the data by selectively filtering out unwanted data or by triggering on sequences that are repeated and choosing only to keep a record of a single repeated sequence (while discarding the others).

At step 806, the results associated with the monitoring are saved in a storage module 550 programmed into the IPA.

Subsequently, at step 808, the results are transmitted to the software application program associated with the IPA 534 executing on the system controller.

At step 810, decoding is performed by decoder module 503 to identify error conditions in the results.

Finally, at step 812, the results are formatted by formatter module 502 to prepare them for display in the GUI 510.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method of monitoring communications between a device under test (DUT) and an automated test equipment (ATE), the method comprising:
   with respect to an interface core and a protocol analyzer module that have been programmed onto a programmable logic device, controlling the programmable logic device by a system controller to generate commands and data to test a DUT, wherein the interface core is operable to generate signals to communicate with the DUT using a protocol associated with the DUT;
   monitoring data and command traffic associated with the protocol in the interface core using the protocol analyzer module;
   storing results associated with the monitoring in a memory comprised within the protocol analyzer module; and
   transmitting the results upon request to an application program associated with the protocol analyzer module executing on the system controller.

2. The method of claim 1, wherein the programmable logic device comprises a Field Programmable Gate Array (FPGA).

3. The method of claim 1, further comprising:
   performing post-processing on the results; and
   displaying the results graphically on a screen.

4. The method of claim 1, wherein the protocol emulated by the interface core is selected from the group consisting of: Universal Flash Storage (UFS), Peripheral Component Interconnect Express (PCIe), Non-Volatile Memory Express (NVMe), Serial AT Attachment (SATA) and Serial Attached SCSI (SAS).

5. The method of claim 1, wherein the monitoring comprises monitoring the data and command traffic in each protocol layer of a protocol stack associated with the protocol implemented in the interface core.

6. The method of claim 5, wherein the monitoring further comprises monitoring the data and command traffic in a physical layer of the protocol stack, wherein the physical layer comprises voltage signals communicated with the DUT.

7. The method of claim 1, wherein the protocol analyzer module comprises a filtering module, and wherein the monitoring comprises:
   prior to the storing, filtering out unwanted subsets of data from the data and command traffic using the filtering module.

8. The method of claim 1, wherein the protocol analyzer module comprises a triggering module, and wherein the monitoring comprises:
   prior to the storing, using the triggering module to recognize patterns of data in the data and command traffic; and
   performing actions in response to the triggering module recognizing patterns of data in the data and command traffic.

9. The method of claim 1 further comprising:
   decoding the results to identify error conditions therein;
   formatting the results; and
   displaying the results in a graphic user interface (GUI).

10. An apparatus for diagnosing a cause of failure using automated test equipment (ATE), the apparatus comprising:
    a computer system comprising a system controller, wherein the system controller is communicatively coupled to a site module board comprising a tester processor and a programmable logic device, wherein the system controller is operable to transmit instructions to perform a test on a device under test (DUT) to the tester processor and the programmable logic device; and
    the programmable logic device operable to be communicatively coupled to the DUT and operable to generate commands and data for executing the test on the DUT, and wherein the programmable logic device comprises a protocol analyzer module and an interface core programmed on the programmable logic device, wherein the interface core is operable to generate signals to communicate with the DUT using a protocol associated with the DUT and wherein the protocol analyzer module is operable to:
    monitor data and command traffic associated with the protocol in the interface core;
    filter information from the data and command traffic relevant to a user to create a filtered subset of data;
    store the filtered subset of data results in a memory associated with the protocol analyzer module; and
    transmit the results upon request to an application program associated with the protocol analyzer module executing on the system controller.

11. The apparatus of claim 10, wherein the programmable logic device comprises a Field Programmable Gate Array (FPGA).

12. The apparatus of claim 10, further comprising a display screen and wherein the tester application program is operable to:
    perform post-processing on the results; and
    display the results graphically on the display screen.

13. The apparatus of claim 10, wherein to monitor the data, the protocol analyzer module is operable to:
    monitor the data and command traffic in each protocol layer of a protocol stack associated with the protocol implemented in the interface core.

14. The apparatus of claim 10, wherein to monitor the data, the protocol analyzer module is further operable to:
    monitor the data and command traffic in a physical layer of the protocol stack, wherein the physical layer comprises voltage signals communicated with the DUT.

15. The apparatus of claim 10, wherein the tester application program is operable to:
- decode the results to identify error conditions in the results;
- format the results; and
- display the results in a graphic user interface (GUI) for a user.

16. A tester comprising:
- a system controller for controlling a test program for testing a plurality of DUTs;
- a plurality of modules coupled to the system controller and operable to interface with and test the plurality of DUTs, wherein each module comprises a site module board, and wherein each site module board comprises:
  - a tester processor coupled to communicate with the system controller to receive instructions and data therefrom in accordance with the test program; and
  - a plurality of programmable logic devices coupled to the tester processor, each programmable logic device comprising an interface core and operable to generate test data for application to a respective DUT, and to receive and to compare test data generated by the respective DUT, and wherein the interface core of each programmable logic device is operable to be programmed to communicate with the respective DUT using a communication protocol compatible with the respective DUT, and wherein each of the programmable logic devices comprises a protocol analyzer module, wherein the protocol analyzer module is programmed on the programmable logic device and is operable to:
    - monitor data and command traffic associated with the protocol in the interface core;
    - perform an action on the data and command traffic in response to a trigger;
    - store a subset of data resulting from the action in a memory associated with the protocol analyzer module; and
    - transmit the results upon request to an application program associated with the protocol analyzer module executing on the system controller.

17. The tester of claim 15, wherein the programmable logic device comprises a Field Programmable Gate Array (FPGA).

18. The tester of claim 15, further comprising a display screen and wherein the tester application program is operable to:
- perform post-processing on the results; and
- display the results graphically on the display screen.

19. The tester of claim 15, wherein the trigger is generated responsive to recognizing a pattern of data, and wherein the action comprises storing a number of occurrences of the pattern of data.

20. The tester of claim 15, wherein the trigger is generated responsive to recognizing a sequence of data packets, and wherein the action comprises determining if the sequence of data packets is in accordance with a specification for the protocol.

21. The tester of claim 15, wherein to monitor the data, the protocol analyzer module is operable to:
- monitor the data and command traffic in each protocol layer of a protocol stack associated with the protocol implemented in the interface core.

* * * * *